US011047592B2

(12) United States Patent
Kawai et al.

(10) Patent No.: US 11,047,592 B2
(45) Date of Patent: Jun. 29, 2021

(54) WIRE FASTENER FOR INDOOR UNIT OF AIR-CONDITIONING APPARATUS

(71) Applicant: Mitsubishi Electric Corporation, Tokyo (JP)

(72) Inventors: Shinji Kawai, Tokyo (JP); Masato Ishikawa, Tokyo (JP); Akimoto Suzuki, Tokyo (JP); Masahide Kinami, Tokyo (JP); Hisanori Ikeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 312 days.

(21) Appl. No.: 15/774,058

(22) PCT Filed: Jan. 8, 2016

(86) PCT No.: PCT/JP2016/050580
§ 371 (c)(1),
(2) Date: May 7, 2018

(87) PCT Pub. No.: WO2017/119139
PCT Pub. Date: Jul. 13, 2017

(65) Prior Publication Data
US 2018/0320923 A1    Nov. 8, 2018

(51) Int. Cl.
*F24F 13/20*    (2006.01)
*H05K 5/02*    (2006.01)
(Continued)

(52) U.S. Cl.
CPC ............ *F24F 13/20* (2013.01); *F24F 1/0007* (2013.01); *H01R 13/58* (2013.01); *H05K 5/0247* (2013.01);
(Continued)

(58) Field of Classification Search
CPC ...... F24F 13/20; F24F 1/0007; H05K 5/0247; H05K 7/14; H02G 3/081; H02G 3/32
(Continued)

(56) References Cited

U.S. PATENT DOCUMENTS

2012/0298404 A1    11/2012    Tokunaga et al.

FOREIGN PATENT DOCUMENTS

| CN | 204597375 U | * | 8/2015 |
| CN | 204597375 U |   | 8/2015 |

(Continued)

OTHER PUBLICATIONS

English Translation JPH659721U (Year: 2019).*
(Continued)

*Primary Examiner* — Edward F Landrum
*Assistant Examiner* — Melodee Jefferson
(74) *Attorney, Agent, or Firm* — Posz Law Group, PLC (57) ABSTRACT

An indoor unit for an air-conditioning apparatus includes a wire attachment part on which a wire is placed, a wire retainer configured to retain the wire placed on the wire attachment part, a wall part provided on one lateral side of the wire attachment part, and having a plurality of opening ports each configured to receive a protrusion part formed at one end of the wire retainer, a plurality of boss parts provided on the other lateral side of the wire attachment part, and having heights different from each other, the wire retainer having the other end to be fastened to any one of the plurality of boss parts, and a fastener configured to fasten the wire retainer to the one of the plurality of boss parts.

5 Claims, 10 Drawing Sheets

(51) Int. Cl.
  *H05K 7/14* (2006.01)
  *H01R 13/58* (2006.01)
  *F24F 1/0007* (2019.01)
  *H02G 3/08* (2006.01)
  *H02G 3/32* (2006.01)
  *F24F 13/14* (2006.01)

(52) U.S. Cl.
  CPC ........ *H05K 7/14* (2013.01); *F24F 2013/1453* (2013.01); *H02G 3/081* (2013.01); *H02G 3/32* (2013.01)

(58) Field of Classification Search
  USPC ............................ 174/480, 520; 439/449, 472
  See application file for complete search history.

(56) References Cited

FOREIGN PATENT DOCUMENTS

| | | | |
|---|---|---|---|
| EP | 2530798 A1 | | 12/2012 |
| FR | 2323255 A2 | | 4/1977 |
| JP | H03-095328 A | | 4/1991 |
| JP | H06-59721 U | | 8/1994 |
| JP | H0659721 U | * | 8/1994 |
| JP | H0395328 A | * | 3/1995 |
| JP | H09-089290 A | | 4/1997 |
| KR | 100823344 B1 | * | 4/2008 |

OTHER PUBLICATIONS

English Translation CN204597375 (Year: 2019).*
English Translation JP-H0395328-A (Year: 2020).*
English Translation KR-100823344-B1 (Year: 2020).*
Extended European Search Report dated Dec. 11, 2018 issued in corresponding EP patent application No. 16883642.7.
International Search Report of the International Searching Authority dated Apr. 5, 2016 for the corresponding international application No. PCT/JP2016/050580 (and English translation).
Office Action dated May 21, 2019 issued in corresponding JP patent application No. 2017-560026 (and English translation).
Office Action dated Dec. 25, 2019 issued in corresponding CN patent application No. 201680077436.8 (and English translation).

* cited by examiner

Related Art

WIRE FASTENER FOR INDOOR UNIT OF AIR-CONDITIONING APPARATUS

CROSS REFERENCE TO RELATED APPLICATION

This application is a U.S. national stage application of PCT/JP2016/050580 filed on Jan. 8, 2016, the contents of which are incorporated herein by reference.

TECHNICAL FIELD

The present invention relates to an indoor unit for an air-conditioning apparatus, and in particular, relates to a wire fastening structure.

BACKGROUND ART

An indoor unit for an air-conditioning apparatus includes a wire fastening structure for fastening a wire inducing electricity supplied from a power source to the indoor unit. In some cases, a wire fastening structure in an indoor unit for a conventional air-conditioning apparatus fastens a plurality of wires having different thicknesses by decreasing or increasing a fastening amount of a screw inserted into a wire retainer (for example, refer to Patent Literature 1).

CITATION LIST

Patent Literature

Patent Literature 1: Japanese Unexamined Patent Application Publication No. 9-89290

SUMMARY OF INVENTION

Technical Problem

In a conventional wire fastening structure such as the one described in Patent Literature 1, as the plurality of wires having different thicknesses are fastened by decreasing or increasing the fastening amount of the screw, how much fastening force is required by a worker is unclear. Consequently, when the fastening force decreases, the wire may fall off, and when the fastening force is increased, the wire may be broken. In other words, whether the conventional wire fastening structure as described in Patent Literature 1 works depends on skills of a worker.

The present invention has been made to solve the above problem, and has an object to provide an indoor unit for an air-conditioning apparatus including a wire fastening structure capable of sharing and fastening a plurality of wires having different thicknesses with a moderate retaining force.

Solution to Problem

An indoor unit for an air-conditioning apparatus according to one embodiment of the present invention includes a wire fastening structure configured to fasten a wire. The wire fastening structure includes a wire attachment part on which the wire is placed, a wire retainer configured to retain the wire placed on the wire attachment part, a wall part provided on one lateral side of the wire attachment part, and having a plurality of opening ports each configured to receive a protrusion part formed at one end of the wire retainer, a plurality of boss parts provided on the other lateral side of the wire attachment part, and having heights different from each other, the wire retainer having the other end to be fastened to any one of the plurality of boss parts, and a fastener configured to fasten the wire retainer to the one of the plurality of boss parts.

Advantageous Effects of Invention

In the indoor unit for the air-conditioning apparatus according to one embodiment of the present invention, as the above-described wire fastening structure is provided, it is possible to share and fasten a plurality of wires having different thicknesses with a moderate retaining force.

DESCRIPTION OF EMBODIMENTS

Hereinafter, one embodiment of the present invention will be described with appropriate reference to drawings. Note that, in the following drawings including FIG. 1, relations between sizes of components in the following figures are different from those in actuality in some cases. Moreover, in the following drawings including FIG. 1, components assigned with the same reference signs are the same or corresponding components, and this is common in all the sentences in this specification. Further, forms of components represented in all the sentences in this specification are only examples, which do not limit the present invention to these descriptions.

Figure 1:
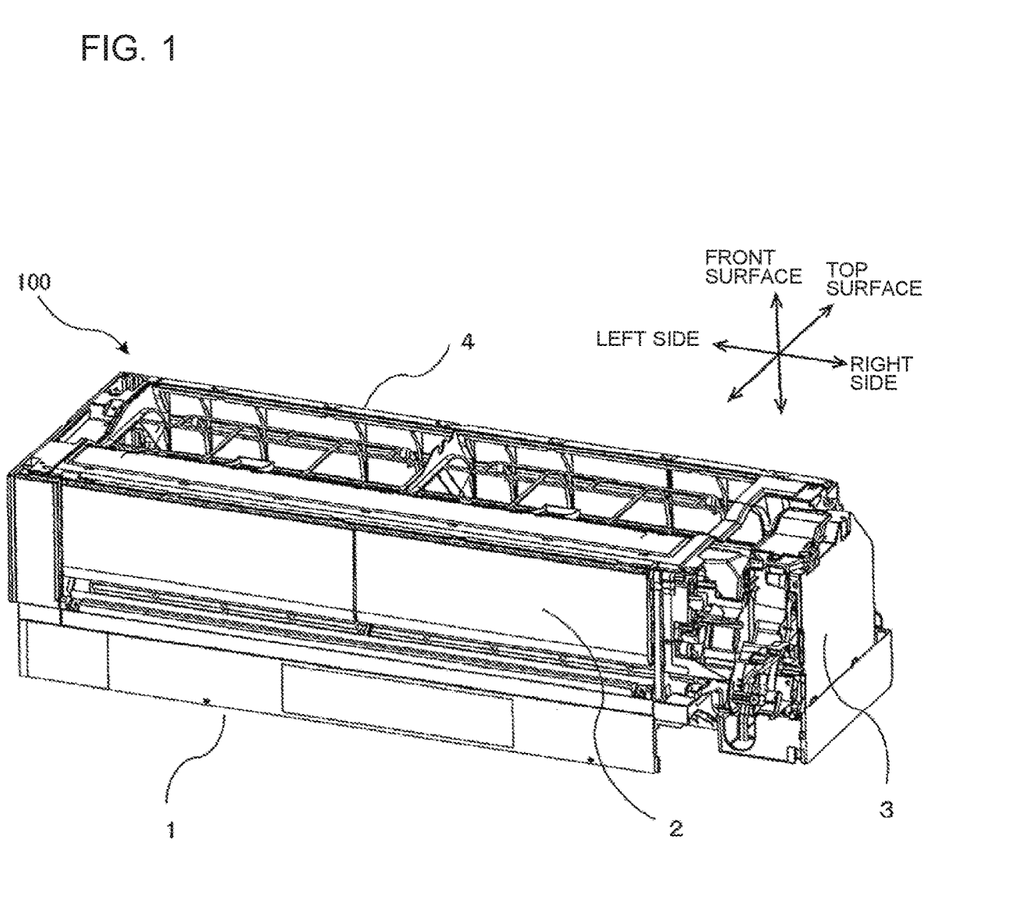
FIG. 1 is an exploded perspective view of a part of an indoor unit for an air-conditioning apparatus according to one embodiment of the present invention.
Figure 2:
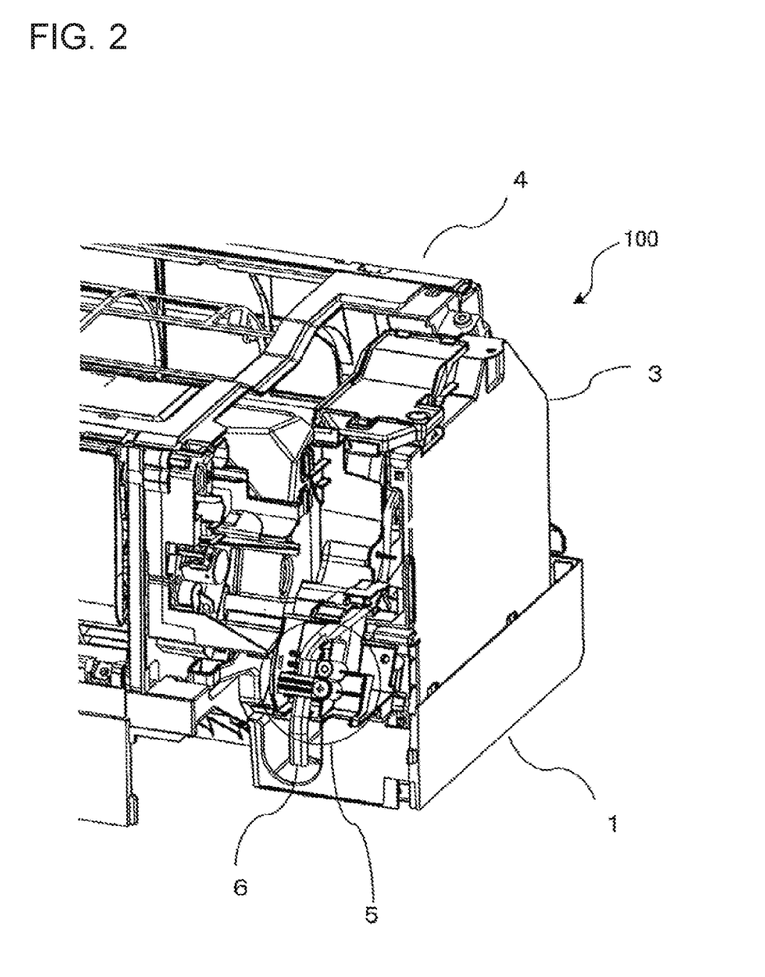
FIG. 2 is an enlarged perspective view showing a part of the indoor unit for the air-conditioning apparatus according to the embodiment of the present invention.
Figure 3:
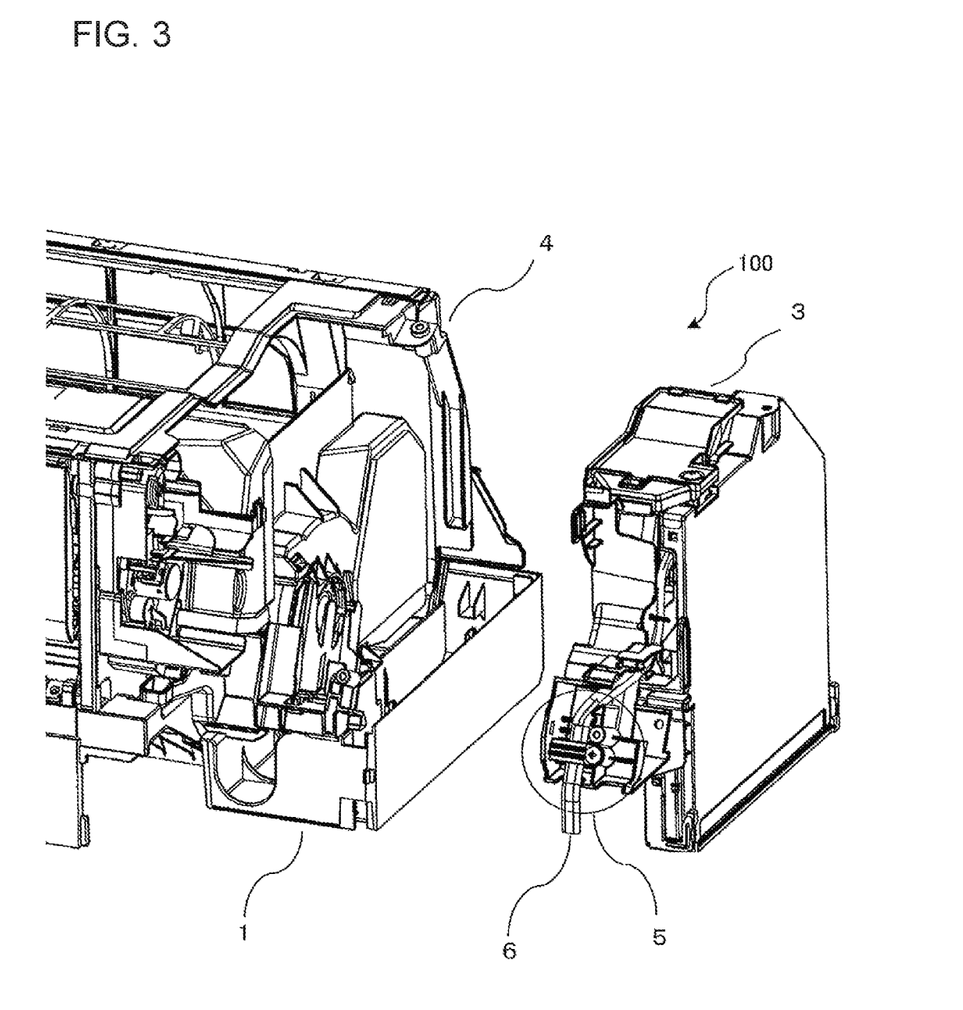
FIG. 3 is an exploded perspective view showing the part of the indoor unit for the air-conditioning apparatus according to the embodiment of the present invention.

FIG. 1 is an exploded perspective view of a part of the indoor unit (hereinafter, referred to as the indoor unit 100) for the air-conditioning apparatus according to one embodiment of the present invention. FIG. 2 is an enlarged perspective view showing a part of the indoor unit 100. FIG. 3 is an exploded perspective view showing the part of the indoor unit 100. The indoor unit 100 will be described with reference to FIGS. 1 to 3.

As shown in FIG. 1, the indoor unit 100 is, for example, a wall-mounted indoor unit mounted on an indoor wall, and includes a base 1, an air deflection plate 2, an electrical component 3, and a housing 4.

The base 1 is formed into a box shape and provided to a back side of the indoor unit 100. To the base 1, the air deflection plate 2, the electrical component 3, and the housing 4 are attached. The base 1 is mounted on the indoor wall or other structure, and composed of, for example, a resin material or other material.

The air deflection plate 2 is provided at an air outlet of the housing 4 to adjust the direction of the conditioned air from the air outlet. The electrical component 3 contains a circuit substrate or other elements for controlling operations of the indoor unit 100, and is contained, for example, in one wall side of the housing 4 in the width direction (in FIG. 1, on the right side of the page). The housing 4 is attached to the base 1. In the housing 4, an air sending fan, a heat exchanger, refrigerant pipes, and the electrical component 3 are contained. Note that, at a position facing the air sending fan in the housing 4, an air path allowing circulation of sucked air is formed.

At a lower back portion of the electrical component 3, a wire fastening tool 5 is provided. The wire fastening tool 5 fastens a wire 6 inducing electricity supplied from a power source to the indoor unit 100. The wire fastening tool 5 corresponds to "wire fastening structure" of the present invention. One end of the wire 6 is connected to a terminal block or the circuit substrate contained in the electrical component 3, and the other end is connected, for example, to a wall socket in a room. Here, the wire 6 includes an inside-outside connecting wire, a power cable, and other wires.

The air-sending fan is composed of, for example, a crossflow fan or other fan, and configured to be driven to suck indoor air from an upper portion of the housing 4 and blow out conditioned air from the air outlet of the housing 4. The heat exchanger acts as an evaporator in cooling operation and acts as a condenser in heating operation. The heat exchanger is provided upstream of the air sending fan on the air path of the housing 4. The heat exchanger is made of, for example, heat transfer pipes and a plurality of fins to which the heat transfer pipes are inserted, and has a shape enclosing a front surface and a top surface of the air sending fan. The refrigerant pipe is coupled to the heat exchanger, and, for example, allows circulation of refrigerant with an outdoor unit installed outdoors.

An operation example of the indoor unit 100 will be briefly described.

When the air sending fan is driven, air is sucked from an air inlet at the upper portion of the housing 4. The sucked air is subjected to heat exchange with the refrigerant in the heat exchanger, and thereby the conditioned air, which is cold air or warm air, is generated. Subsequently, the direction of the generated conditioned air is adjusted by the air deflection plate 2, and the conditioned air is sent to a space to be air-conditioned (for example, indoors or other space) from the air outlet at a lower portion of the housing 4.

Figure 4:
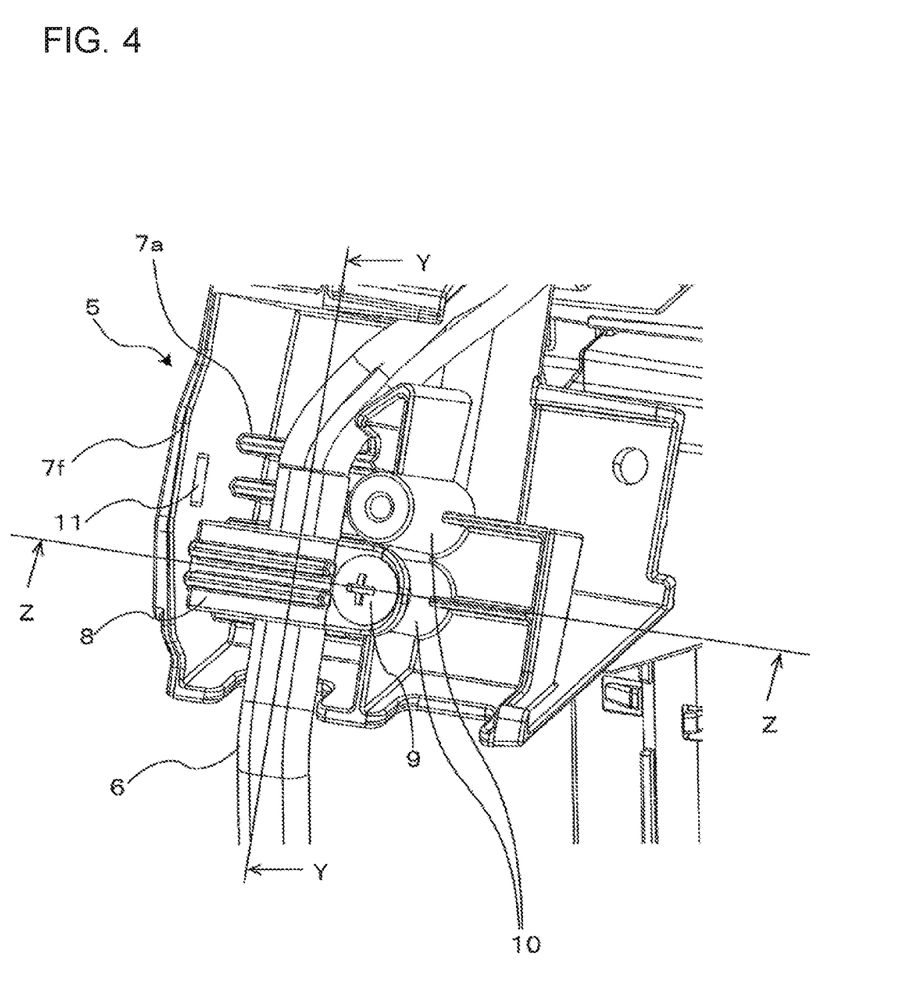
FIG. 4 is an enlarged perspective view showing a peripheral portion of a wire fastening tool in the indoor unit for the air-conditioning apparatus according to the embodiment of the present invention.
Figure 5:
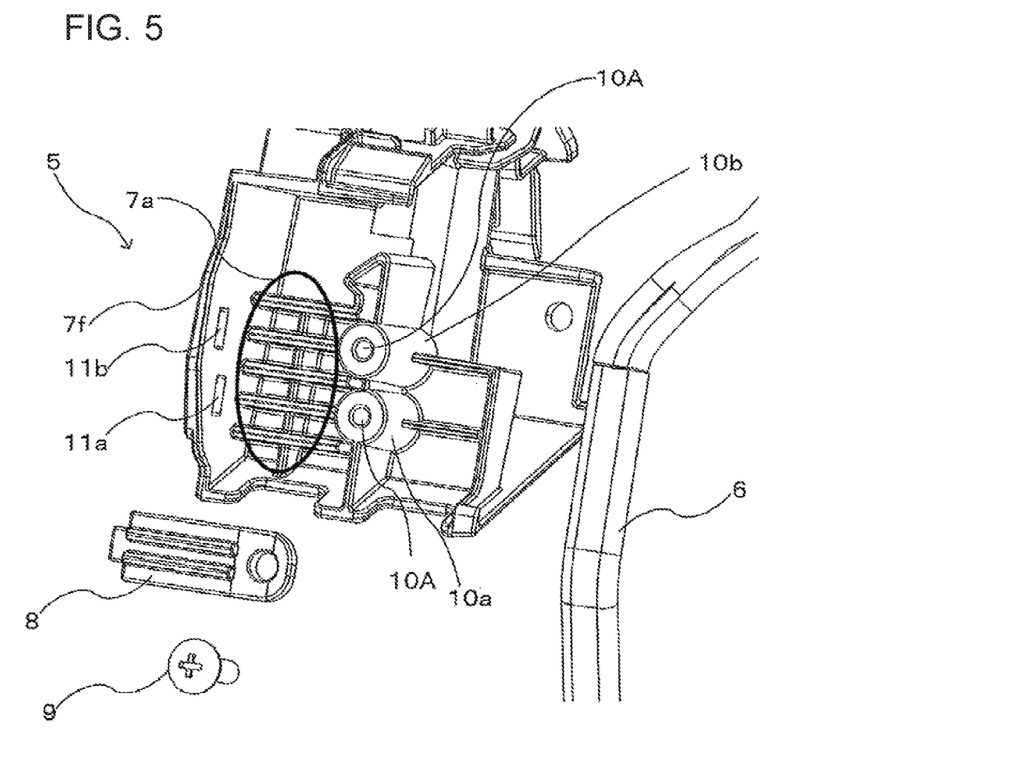
FIG. 5 is an enlarged and exploded perspective view showing an exploded state of the wire fastening tool in the indoor unit for the air-conditioning apparatus according to the embodiment of the present invention.
Figure 6:
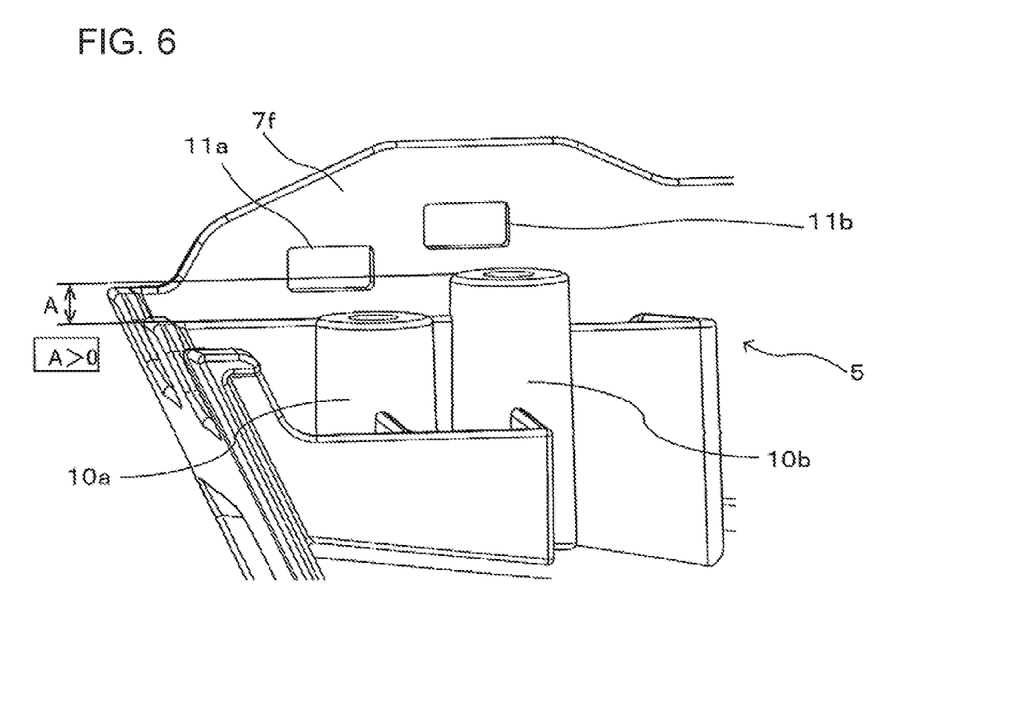
FIG. 6 is a schematic side view showing a state of the wire fastening tool in the indoor unit for the air-conditioning apparatus according to the embodiment of the present invention as viewed from a side direction.
Figure 7:
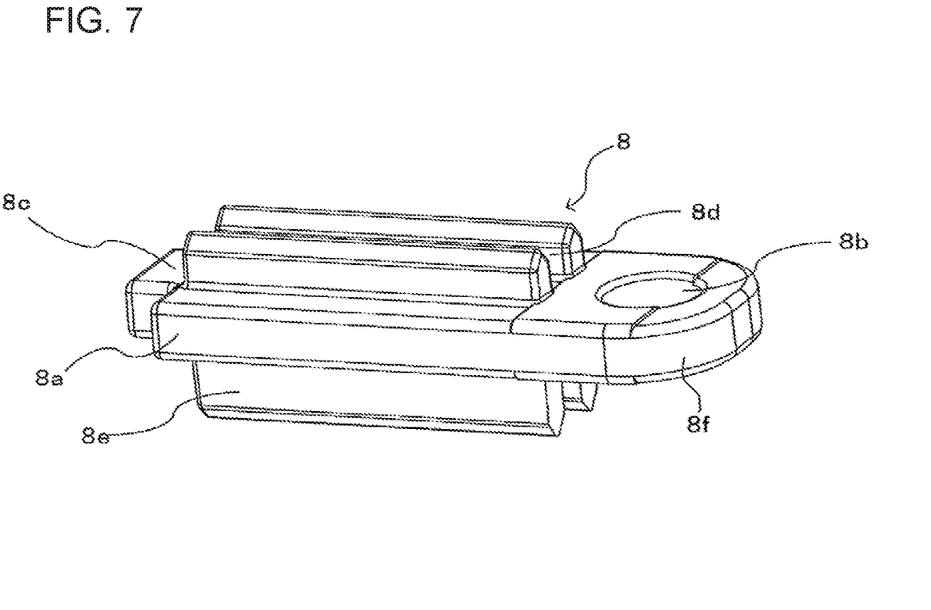
FIG. 7 is an enlarged perspective view showing a wire retainer of the indoor unit for the air-conditioning apparatus according to the embodiment of the present invention.
Figure 8:
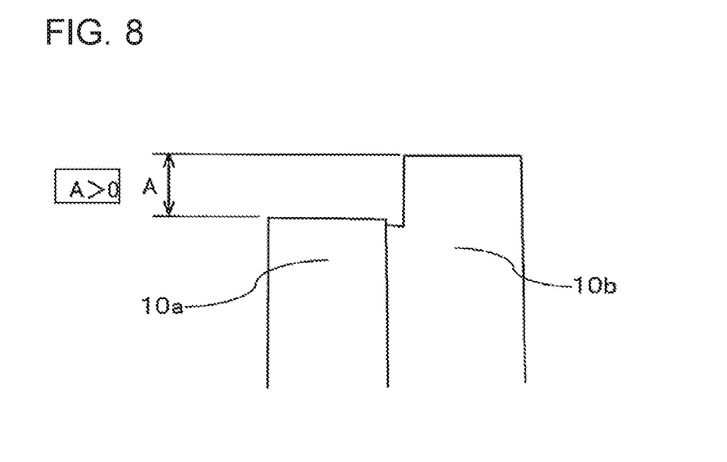
FIG. 8 is an illustration diagram for illustrating an example of heights of boss parts in the indoor unit for the air-conditioning apparatus according to the embodiment of the present invention.
Figure 9:
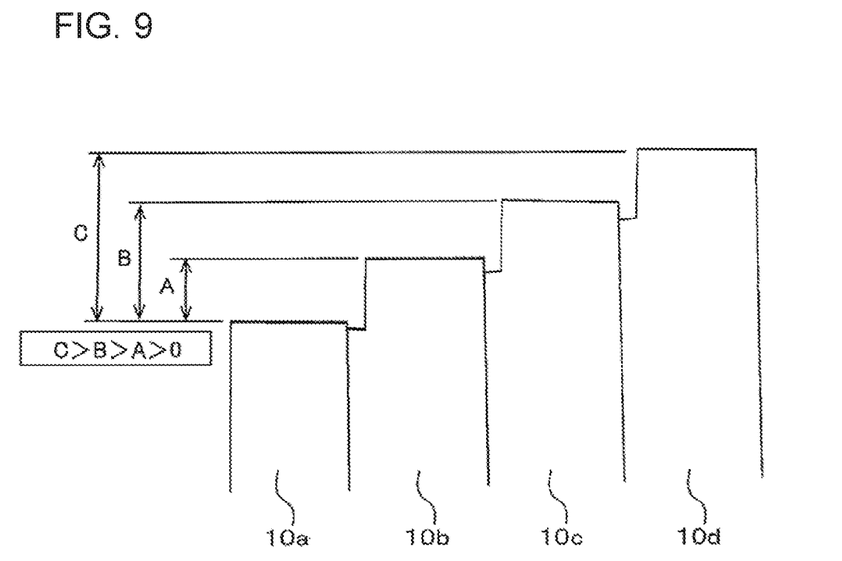
FIG. 9 is an illustration diagram for illustrating another example of heights of the boss parts in the indoor unit for the air-conditioning apparatus according to the embodiment of the present invention.
Figure 10:
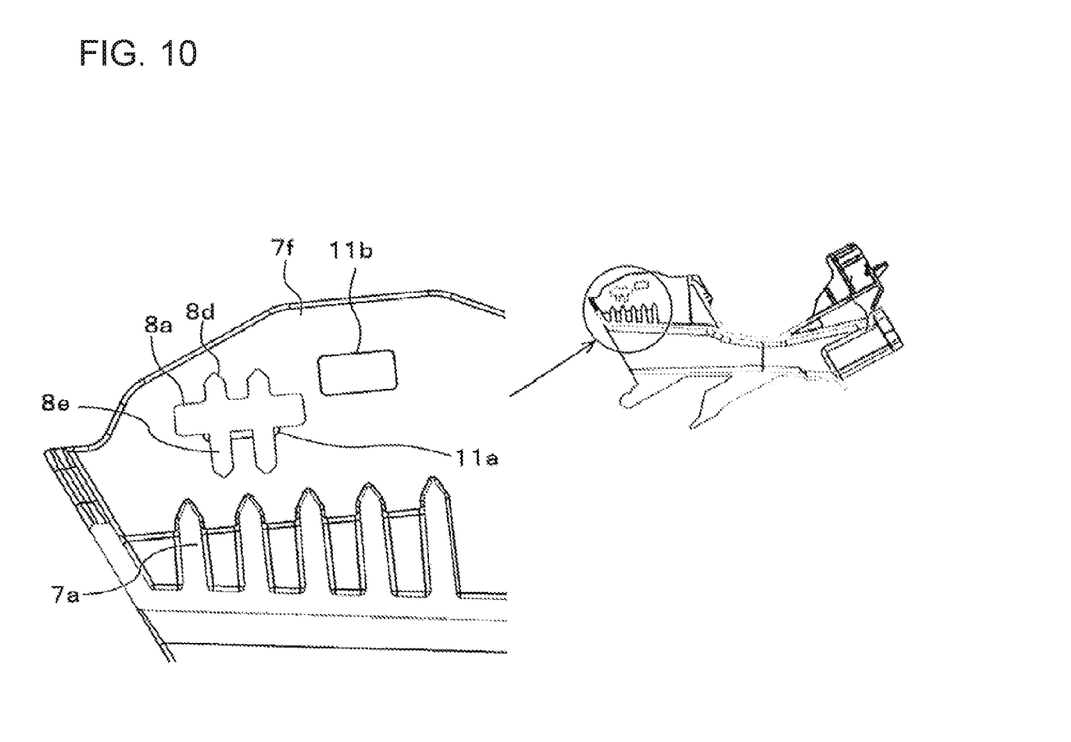
FIG. 10 is an enlarged schematic cross-sectional view showing a configuration of a power source fastening tool in the indoor unit for the air-conditioning apparatus according to the embodiment of the present invention.
Figure 11:
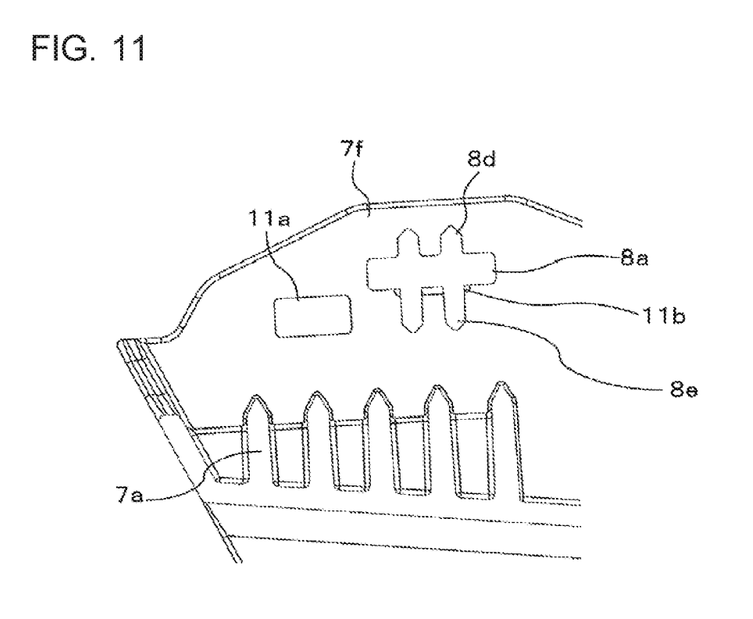
FIG. 11 is an enlarged schematic cross-sectional view showing a configuration of the power source fastening tool in the indoor unit for the air-conditioning apparatus according to the embodiment of the present invention.

FIG. 4 is an enlarged perspective view showing a peripheral portion of the wire fastening tool 5 in the indoor unit 100. FIG. 5 is an enlarged and exploded perspective view showing an exploded state of the wire fastening tool 5 in the indoor unit 100. FIG. 6 is a schematic side view showing a state of the wire fastening tool 5 in the indoor unit 100 as viewed from a side direction. FIG. 7 is an enlarged perspective view showing a wire retainer 8 of the indoor unit 100. FIG. 8 is an illustration diagram for illustrating an example of heights of boss parts 10 in the indoor unit 100. FIG. 9 is an illustration diagram for illustrating another example of heights of the boss parts 10 in the indoor unit 100. FIGS. 10 and 11 are enlarged schematic cross-sectional views showing a configuration of the wire fastening tool 5 in the indoor unit 100. The wire fastening tool 5 will be described with reference to FIGS. 4 to 7.

As described above, the wire 6 includes the inside-outside connecting wire, the power cable, and other wires, and is composed by shaping these wires into one with a cover made of, for example, a resin. The thickness of the cover is often determined by specifications of the indoor unit 100 or standards of each country, and is not standardized. The wire 6 is, as shown in FIG. 4, to be attached to the wire fastening tool 5 to extend in the vertical direction on the page. Note that, in FIG. 4, a state in which the wire 6 is attached is shown. Moreover, in FIGS. 5, 6, 10, and 11, a state in which the wire 6 is detached is shown. Further, FIGS. 10 and 11 each show a Y-Y schematic cross section in FIG. 4.

As shown in FIG. 5, the wire fastening tool 5 is composed of a wire attachment part 7a, a wall part 7f on one lateral side of the wire attachment part 7a (the left side on the page), the wire retainer 8, a screw 9, and the boss parts 10 on the other lateral side of the wire attachment part 7a (the right side on the page).

As shown in FIGS. 5, 10, and 11, the wire attachment part 7a is formed as a plurality of projecting ribs, and the wire 6 is placed on projecting surfaces of the ribs. Note that the shape of the wire attachment part 7a is not limited to the shape shown in the figure. For example, the wire attachment part 7a may be formed as, not the ribs, but a flat surface, a curved surface, or a bumped surface. Moreover, the number or size of the ribs is not particularly limited. By forming the wire attachment part 7a into ribs, it is possible, not only to fasten the wire 6 strongly, but also to moderate contact pressure applied to the wire 6.

The wall part 7f is provided to stand at one lateral side of the wire attachment part 7a, and a plurality of opening ports 11 are formed on the wall part 7f. In each of the opening ports 11, a protrusion 8c of the wire retainer 8 can be received. The opening ports 11 of the same number as that of the boss parts 10 are formed. Moreover, the opening ports 11 are each formed at positions facing a corresponding one of the boss parts 10. One of the opening ports 11 formed at a position facing an upper portion of a first boss part 10a is illustrated as a first opening port 11a, and the other one of the opening ports 11 formed at a position facing an upper portion of a second boss part 10b is illustrated as a second opening port 11b. Consequently, the first opening port 11a and the second opening port 11b are not formed to be aligned in the longitudinal direction. Note that, the wall part 7f may be a wall surface constituting a part of the electrical component 3, or such a wall surface as additionally attached to the electrical component 3 may serve as the wall part 7f.

The wire retainer 8 retains the wire 6 placed on the wire attachment part 7a from above. As shown in FIG. 7, the wire retainer 8 includes a base plate 8a substantially in a rectangular shape, a projection part 8f formed on one end in the long side direction of the base plate 8a, and the protrusion 8c provided on the other end in the long side direction of the base plate 8a. Moreover, on one rectangular surface of the base plate 8a, first retaining ribs 8d are provided and protrude outward from the rectangular surface. Further, on a surface of the base plate 8a opposite to the first retaining ribs 8d, second retaining ribs 8e are provided and protrude outward from the surface to have height different from the first retaining ribs 8d. In the projection part 8f, a screw insertion hole 8b is formed to penetrate the projection part 8f.

The first retaining ribs 8d and the second retaining ribs 8e are formed to extend in the long side direction of the base plate 8a of the wire retainer 8. Moreover, the plurality of first retaining ribs 8d and the second retaining ribs 8e are provided to protrude outward to moderate contact pressure to the wire 6. In a state in which the protrusion 8c of the wire retainer 8 is received in any one of the opening ports 11, the first retaining ribs 8d or the second retaining ribs 8e are alternating with the ribs constituting the wire attachment part 7a. This configuration makes it possible to moderate the force for retaining the wire 6. However, the wire attachment part 7a is composed of a surface in some cases. Further, each of the first retaining ribs 8d and the second retaining ribs 8e is configured into a taper shape in which its width is reduced toward the tip end.

Note that, here, a case is exemplified in which the two first retaining ribs 8d and the two second retaining ribs 8e are formed; however, one rib or three or more ribs may be formed. Moreover, any one of a set of the first retaining ribs 8d and a set of the second retaining ribs 8e may be higher than the other set, but here, for the purpose of explanation, the set of the second retaining ribs 8e is higher than the set of the first retaining ribs 8d. Further, the case is exemplified in which the first retaining ribs 8d and the second retaining ribs 8e are each formed into the taper shape; however, the shape may have the same width toward the tip end.

The screw 9 is a fastener for attaching the wire retainer 8 to the wire attachment part 7a. Note that, here, description will be given to the screw 9 as an example of the fastener; however, the fastener is not limited to the screw 9. For example, the wire retainer 8 may be attached to the wire attachment part 7a by forming the projection part 8f into a claw part to be latched in any one of the portions where the boss parts 10 are formed.

The boss parts 10 each have a screw hole 10A formed on any one of the boss parts 10 into which the screw 9 is screwed, and are provided on the other lateral side of the wire attachment part 7a. The boss parts 10 are provided at a position facing the screw insertion hole 8b of the wire retainer 8 and the opening ports 11. The boss parts 10 are composed of a plurality of pieces having different heights, and the plurality of pieces are disposed along the direction in which the wire 6 to be retained extends. FIGS. 4 to 6 exemplify a case in which two boss parts 10 are provided, and the lower piece is illustrated as a first boss part 10a, and the higher piece is illustrated as a second boss part 10b.

In FIG. 8, the difference in height between the top surface of the first boss part 10a and the top surface of the second boss part 10b is shown as A. The difference A is larger than 0, and is not particularly specified to any numerical value. The difference A is determined depending on expected thicknesses of the wires 6.

Note that the number of the boss parts 10 may be three or more. In this case, as shown in FIG. 9, the boss parts 10 are arranged in a stepwise shape as viewed from the lateral side. In FIG. 9, the boss parts 10 are illustrated as a first boss part 10a, a second boss part 10b, a third boss part 10c, and a fourth boss part 10d from the lower height. In FIG. 9, the difference in height between the top surface of the first boss part 10a and the top surface of the second boss part 10b is shown as A. The difference in height between the top surface of the first boss part 10a and the top surface of the third boss part 10c is shown as B. The difference in height between the top surface of the first boss part 10a and the top surface of the fourth boss part 10d is shown as C. The differences A, B, and C satisfy a relationship of C>B>A>0, and are not particularly specified to any numerical values. The differences A, B, and C are determined depending on expected thicknesses of the wires 6.

A relationship among the boss parts 10, the wire retainer 8, and the wall part 7f will be specifically described.

When the wire retainer 8 is attached to the first boss part 10a, as shown in FIG. 10, the protrusion 8c is received in the first opening port 11a, the projection part 8f is brought into contact with the first boss part 10a, and the screw 9 is screwed into the screw insertion hole 8b and a corresponding one of the screw holes 10A, to thereby fasten the wire retainer 8. When the wire retainer 8 is attached to the second boss part 10b, as shown in FIG. 11, the protrusion 8c is received in the second opening port 11b, the projection part 8f is brought into contact with the second boss part 10b, and the screw 9 is screwed into the screw insertion hole 8b and a corresponding one of the screw holes 10A, to thereby fasten the wire retainer 8.

Fastening of the wire 6 will be described. Here, description will be given to an example in which the wire retainer 8 is attached to the first boss part 10a and the wire 6 is retained by the first retaining ribs 8d.

First, the wire 6 is placed on the wire attachment part 7a. In that state, the protrusion 8c of the wire retainer 8 is received in any one of the opening ports 11 of the wall part 7f. While the first retaining ribs 8d of the wire retainer 8 are applying pressure to the wire 6, the projection part 8f of the wire retainer 8 and the first boss part 10a are brought into contact with each other. Then, the screw 9 is inserted into the screw insertion hole 8b and the corresponding one of the screw holes 10A and screwed to be attached. Consequently, the wire 6 is fastened.

As described above, wires to be used as the wire 6 may differ in thickness. Then, in the indoor unit 100, the wire retainer 8 is provided with the first retaining ribs 8d and the second retaining ribs 8e that have different heights, and in addition, a plurality of boss parts 10 that have different heights are provided, and consequently, any one of wires 6 having different thicknesses can be fastened.

A structure for fastening two types of wires 6 having different thicknesses will be described.

Figure 12:
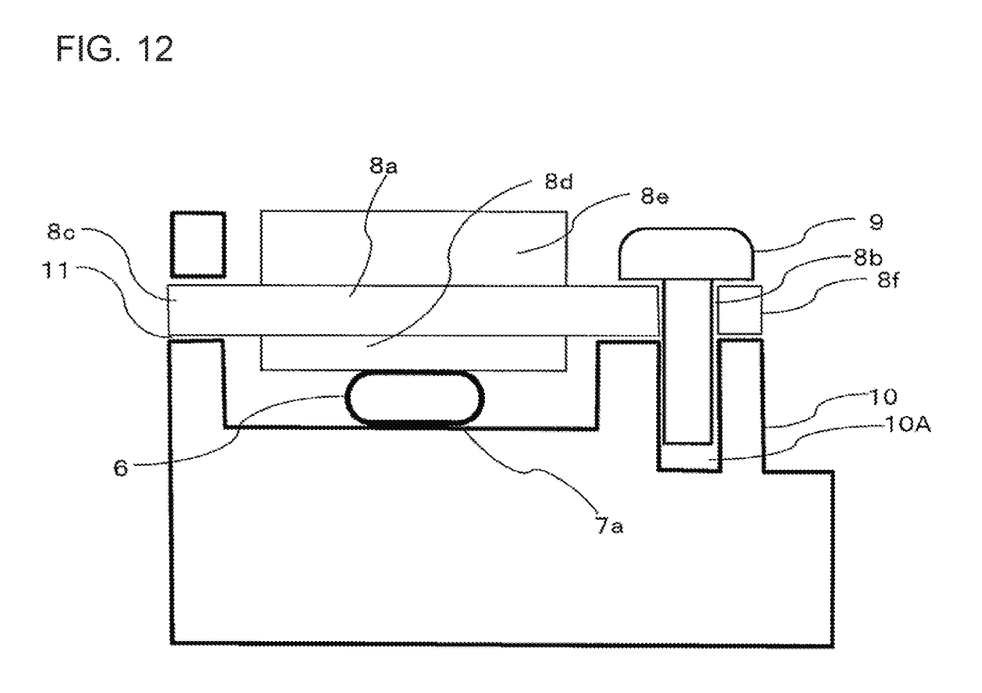
FIG. 12 is an illustration diagram for illustrating a fastening structure in fastening a thicker wire of two types of wires having different thicknesses in the indoor unit for the air-conditioning apparatus according to the embodiment of the present invention.
Figure 13:
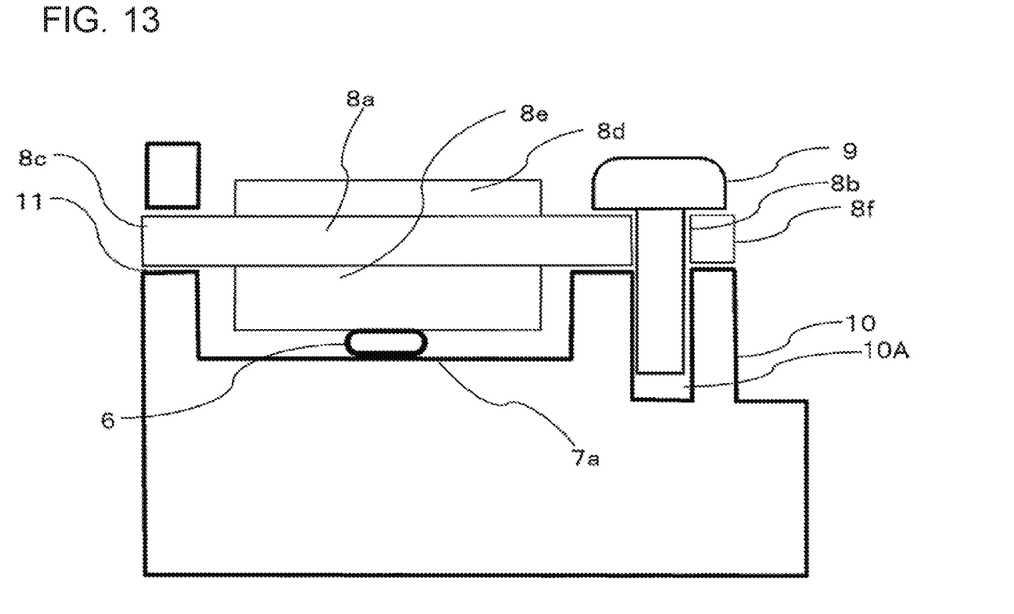
FIG. 13 is an illustration diagram for illustrating a fastening structure in fastening a thinner wire of the two types of wires having different thicknesses in the indoor unit for the air-conditioning apparatus according to the embodiment of the present invention.

FIG. 12 is an illustration diagram for illustrating a fastening structure in fastening a thicker wire of the two types of wires 6 having different thicknesses in the indoor unit 100. FIG. 13 is an illustration diagram for illustrating a fastening structure in fastening a thinner wire of the two types of wires 6 having different thicknesses in the indoor unit 100. Note that the thicknesses are each, in a state in which the wire 6 is placed on the wire attachment part 7a, a distance in the height direction from the placement surface. Moreover, FIGS. 12 and 13 each show a Z-Z schematic cross section in FIG. 4.

As described above, the set of the first retaining ribs 8d and the set of the second retaining ribs 8e of the wire retainer 8 have different heights. Consequently, to retain the thicker wire 6, as shown in FIG. 12, the first retaining ribs 8d, which are lower ribs, are caused to face the wire 6 and retain the wire 6, and thereby the wire 6 can be fastened. Moreover, to retain the thinner wire 6, as shown in FIG. 13, the second retaining ribs 8e, which are higher ribs, are caused to face the wire 6 and retain the wire 6, and thereby the wire 6 can be fastened. In this manner, the two types of wires 6 having different thicknesses can be retained with a moderate retaining force without using a complicated configuration.

For example, in Japan, two types of power cords, 100 V and 200 V, have different thicknesses; however, in the indoor unit 100, the wire fastening tool 5 and the wire retainer 8 can be used as common components for fastening the two types of wires 6 having different thicknesses, and, in either case, it is possible to fasten the wire 6 with the moderate retaining force.

A structure for fastening four types of wires 6 having different thicknesses will be described.

Figure 14:
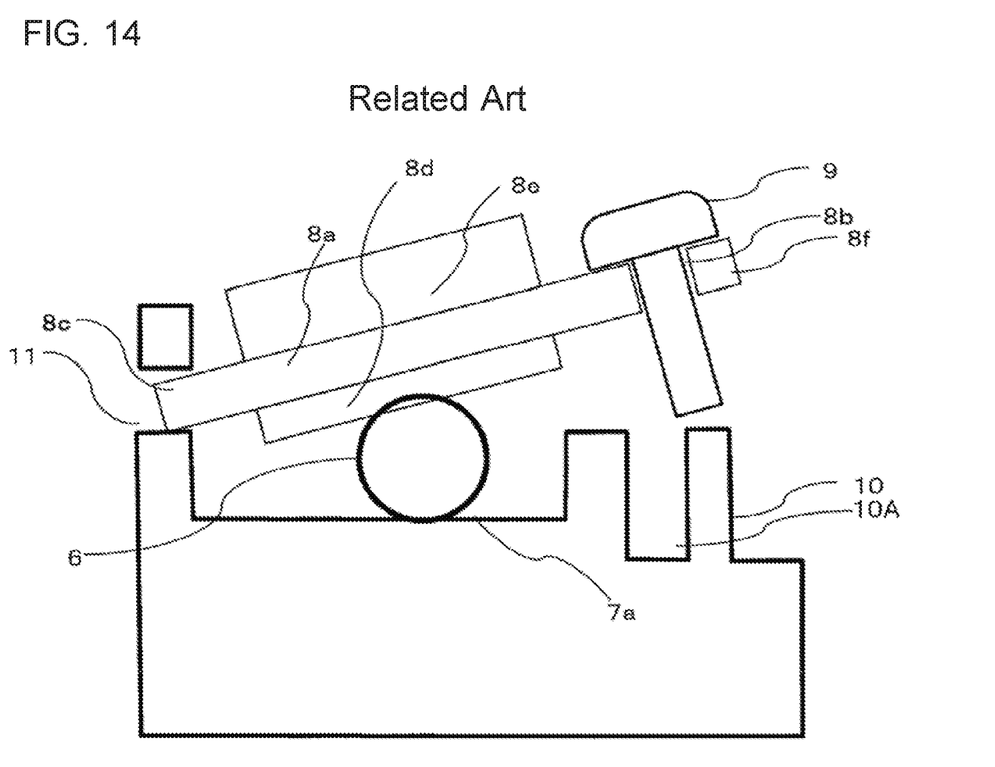
FIG. 14 is an illustration diagram for illustrating a case in which a wire cannot be fastened because of a thickness of the wire in an indoor unit as a comparative example.
Figure 15:
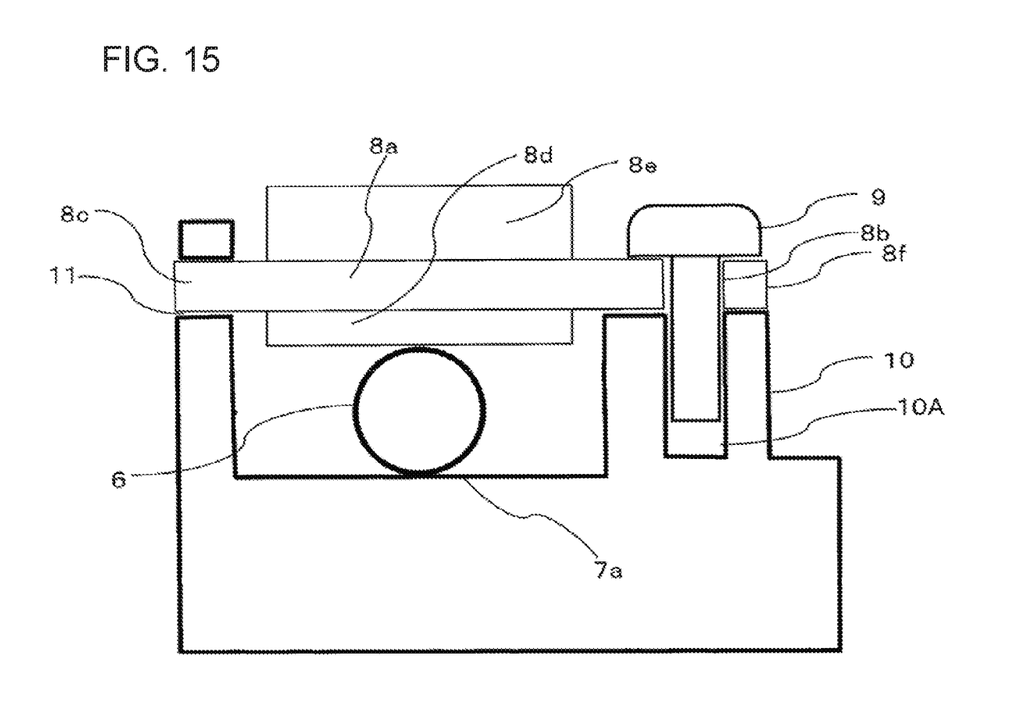
FIG. 15 is an illustration diagram for illustrating a fastening structure in fastening the thickest wire of four types of wires having different thicknesses in the indoor unit for the air-conditioning apparatus according to the embodiment of the present invention.
Figure 16:
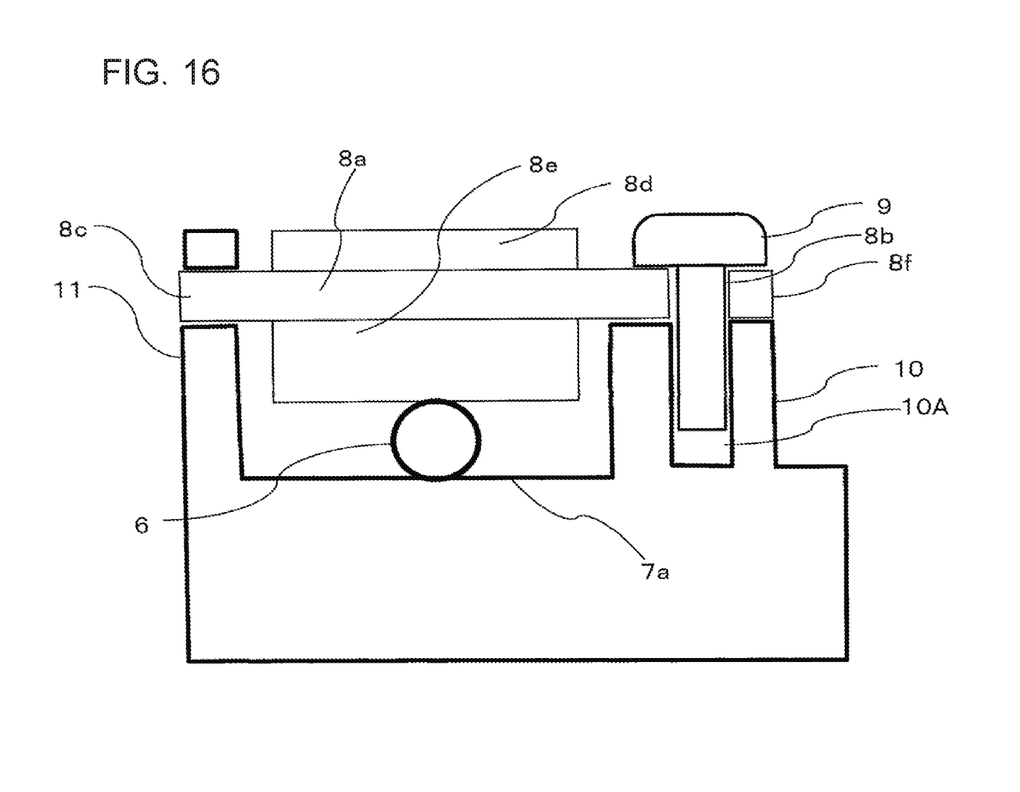
FIG. 16 is an illustration diagram for illustrating a fastening structure in fastening the thinnest wire of the four types of wires having different thicknesses in the indoor unit for the air-conditioning apparatus according to the embodiment of the present invention.

FIG. 14 is an illustration diagram for illustrating a case in which a wire 6 cannot be fastened because of the thickness of the wire 6 in an indoor unit as a comparative example. FIG. 15 is an illustration diagram for illustrating a fastening structure in fastening the thickest wire 6 of the four types of wires 6 having different thicknesses in the indoor unit 100. FIG. 16 is an illustration diagram for illustrating a fastening structure in fastening the thinnest wire of the four types of wires 6 having different thicknesses in the indoor unit 100. Moreover, FIGS. 14 to 16 each show a Z-Z schematic cross section in FIG. 4.

For example, in a case in which any one of two types of wires 6 thicker than the wire 6 shown in FIG. 12 and having different thicknesses is to be fastened by use of the second boss part 10b and the second opening port 11b of the wire fastening tool 5, the wire 6 is too thick to be fastened as shown in FIG. 14.

To solve this problem, in the indoor unit 100, the boss parts 10 and the opening ports 11 of the wire fastening tool 5 are used, and further, differences in height of the set of the first retaining ribs 8d and the set of the second retaining ribs 8e of the wire retainer 8 are used, and consequently, it is possible to retain four types of wires 6 having different thicknesses with a moderate retaining force. Consequently, to retain the thickest wire 6, as shown in FIG. 15, the first retaining ribs 8d, which are lower ribs, are caused to face the wire 6 and retain the wire 6, and thereby the wire 6 can be fastened by use of the second boss part 10b. Moreover, to retain the thinnest wire 6, as shown in FIG. 16, the second retaining ribs 8e, which are higher ribs, are caused to face the wire 6 and retain the wire 6, and thereby the wire 6 can be fastened by use of the first boss part 10a. In this manner, the two types of wires 6 having different thicknesses can be retained with a moderate retaining force without using a complicated configuration.

For example, for fastening four types of wires 6, which are two types of power cords in Japan and two types of power cords outside Japan, having different thicknesses, in the indoor unit 100, the wire fastening tool 5 and the wire retainer 8 can be used as common components, and, in any of the cases, it is possible to fasten the wire 6 with the moderate retaining force.

Note that, here, a case is described in which two combinations made by the two boss parts 10 and the two opening ports 11; however, by increasing the number of the boss parts 10 and the opening ports 11 to increase the number of combinations to three or more, it is possible to increase the types of thicknesses of the wires 6 to be retained (refer to FIG. 9).

As described above, in the indoor unit 100, by using the wire retainer 8 and wire fastening tool 5 as common components, the wires 6 having different thicknesses can be retained with a moderate retaining force.

Moreover, as the indoor unit 100 includes the wire fastening tool 5 configured to fasten the wire 6, and the wire fastening tool 5 includes the wire attachment part 7a on which the wire 6 is placed, the wire retainer 8 configured to retain the wire 6 placed on the wire attachment part 7a, the wall part 7f provided on one lateral side of the wire attachment part 7a, and having the plurality of opening ports 11 each configured to receive the protrusion 8c formed at one end of the wire retainer 8, the plurality of boss parts 10 provided on the other lateral side of the wire attachment part 7a, and having heights different from each other, the wire retainer 8 having the other end to be fastened to any one of the plurality of the boss parts 10, and the fastener (the screw 9) configured to fasten the wire retainer 8 to any one of the boss parts 10, it is possible to share and fasten the plurality of wires 6 having different thicknesses with the moderate retaining force.

Moreover, in the indoor unit 100, as each of the plurality of opening ports 11 faces the upper portion of a corresponding one of the plurality of boss parts 10, it is possible to share and fasten the plurality of wires 6 having different thicknesses with the moderate retaining force.

Moreover, in the indoor unit 100, as the wire retainer 8 includes a plurality of retaining ribs that have different heights to retain the wire 6, by use of the difference in height of the retaining ribs in addition to the plurality of opening ports 11 and the plurality of boss parts 10, it is possible to share and fasten the plurality of wires 6 having different thicknesses.

Moreover, in the indoor unit 100, as the wire retainer 8 includes the base plate 8a, the first retaining ribs 8d formed on one surface of the base plate 8a, and the second retaining ribs 8e formed on the other surface of the base plate 8a, the second retaining ribs 8e having height different from the height of the first retaining ribs 8d, by use of the difference in height between the first retaining ribs 8d and the second retaining ribs 8e in addition to the plurality of opening ports 11 and the plurality of boss parts 10, it is possible to share and fasten the plurality of wires 6 having different thicknesses.

Moreover, in the indoor unit 100, each of the plurality of first retaining ribs 8d and the second retaining ribs 8e include a plurality of ribs, and thereby it is possible to moderate contact pressure to the wire 6.

Moreover, in the indoor unit 100, as the projection part 8f to be fastened to any one of the boss parts 10 is formed on the other end of the wire retainer 8, the screw insertion hole 8b is formed in the projection part 8f, the fastener is composed of the screw 9, and the wire retainer 8 is fastened to any one of the boss parts 10 by screwing the screw 9 to the one of the boss parts 10, it is possible to retain the two types of wires 6 having different thicknesses without using a complicated structure.

Moreover, in the indoor unit 100, as the wire attachment part 7a is composed of the plurality of ribs, it is possible to fasten the wire 6 strongly, and also to moderate contact pressure applied to the wire 6.

REFERENCE SIGNS LIST base 2 air deflection plate 3 electrical component 4 housing 5 wire fastening tool 6 wire 7a wire attachment part 7f wall part 8 wire retainer 8a base plate 8b screw insertion hole 8c protrusion 8d first retaining rib 8e second retaining rib 8f projection part 9 screw 10 boss part 10A screw hole 10a first boss part 10b second boss part 10c third boss part 10d fourth boss part 11 opening port 11a first opening port 11b second opening port 100 indoor unit

The invention claimed is:

1. An indoor unit for an air-conditioning apparatus, the indoor unit comprising:
    a wire fastening structure configured to fasten a wire,
    the wire fastening structure including
    a wire attachment part on which a part of the wire is placed,
    a wire retainer configured to retain the part of the wire placed on the wire attachment part,
    a wall part provided on a first lateral side of the wire attachment part and having a plurality of opening ports, wherein each opening port is configured to receive a protrusion part formed at a first end of the wire retainer,
    boss parts provided on a second lateral side of the wire attachment part and having heights different from each other, wherein the wire retainer has a second end to be fastened to a selected one of the boss parts, and
    a fastener configured to fasten the wire retainer to the selected one of the boss parts, wherein
    the wire retainer includes a base plate and a plurality of retaining ribs, wherein each retaining rib is configured to retain the wire,
    a first retaining rib of the retaining ribs is formed on a first surface of the base plate,
    a second retaining rib of the ribs is formed on a second surface of the base plate, which is opposite to the first surface of the base plate, and
    the second retaining rib extends further from the second surface of the base plate than the first rib extends from the first surface of the base plate.

2. The indoor unit for the air-conditioning apparatus of claim 1, wherein each of the plurality of opening ports faces an upper portion of a corresponding one of the boss parts.

3. The indoor unit for the air-conditioning apparatus of claim 1, wherein the first retaining rib is one of a plurality of first retaining ribs, and the second retaining rib is one of a plurality of second retaining ribs.

4. The indoor unit for the air-conditioning apparatus of claim 1, wherein
    a projection part to be fastened to the selected one of the boss parts is formed on the second end of the wire retainer,
    a screw insertion hole is formed in the projection part,
    the fastener comprises a screw, and
    the wire retainer is fastened to the one of the boss parts by screwing the screw to the selected one of the boss parts.

5. The indoor unit for the air-conditioning apparatus of claim 1, wherein the wire attachment part comprises a plurality of ribs.

* * * * *